(12) United States Patent  
Sakurai et al.

(10) Patent No.: US 10,842,018 B2  
(45) Date of Patent: Nov. 17, 2020

(54) INTERLAYER TRANSMISSION LINE

(71) Applicant: DENSO CORPORATION, Kariya, Aichi-pref. (JP)

(72) Inventors: Kazumasa Sakurai, Nisshin (JP); Kazuya Wakita, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/597,159

(22) Filed: Oct. 9, 2019

(65) Prior Publication Data

US 2020/0045810 A1 Feb. 6, 2020

Related U.S. Application Data

(63) Continuation of application No. PCT/JP2018/012507, filed on Mar. 27, 2018.

(30) Foreign Application Priority Data

Apr. 11, 2017 (JP) ................................. 2017-078251

(51) Int. Cl.  
*H05K 1/02* (2006.01)  
*H05K 1/11* (2006.01)

(52) U.S. Cl.  
CPC ......... *H05K 1/0251* (2013.01); *H05K 1/0222* (2013.01); *H05K 1/111* (2013.01); *H05K 2201/096* (2013.01)

(58) Field of Classification Search  
CPC ........ H05K 1/111; H05K 1/112; H05K 1/113; H05K 1/114; H05K 1/115; H05K 1/116; H05K 1/0222; H05K 1/025; H05K 1/0251; H05K 1/0253  
See application file for complete search history.

(56) References Cited

U.S. PATENT DOCUMENTS

| 6,479,764 | B1 * | 11/2002 | Frana | H05K 1/0222 |
| | | | | 174/262 |
| 2003/0133279 | A1 | 7/2003 | Shirasaki | |
| 2005/0098348 | A1 * | 5/2005 | Okumichi | H01L 23/49827 |
| | | | | 174/262 |
| 2007/0205847 | A1 | 9/2007 | Kushta et al. | |
| 2010/0265153 | A1 | 10/2010 | Devereux et al. | |

FOREIGN PATENT DOCUMENTS

| JP | 2015-050680 A | 3/2015 |
| WO | 2011018938 A1 | 2/2011 |

* cited by examiner

*Primary Examiner* — Jeremy C Norris  
(74) *Attorney, Agent, or Firm* — Maschoff Brennan

(57) ABSTRACT

An interlayer transmission line includes a plurality of dielectric layers stacked on each other, a signal via that penetrates the plurality of dielectric layers in a stacking direction, and mutually connects signal patterns disposed on two external faces of the plurality of dielectric layers externally exposed, a ground plane that is disposed between the dielectric layers, and covers an area surrounding a circular removal region centered around the signal via, and a plurality of ground vias that penetrate at least one layer of the dielectric layers in the stacking direction of the dielectric layers, are disposed along a plurality of concentric circles centered around the signal via, and are electrically connected with the ground plane.

15 Claims, 3 Drawing Sheets

INTERLAYER TRANSMISSION LINE

CROSS-REFERENCE TO RELATED APPLICATION

The present application is based on and claims the benefit of priority from earlier Japanese Patent Application No. 2017-078251 filed Apr. 11, 2017, the description of which is incorporated herein by reference.

BACKGROUND

Technical Field

The present disclosure relates to a technology for transmitting a signal through a multilayer substrate in a stacking direction.

Related Art

A technique forms a low-loss transmission line (hereinafter, interlayer transmission line) used for signal transmission in the stacking direction of a substrate by mutually connecting signal line patterns routed on both faces of a multilayer wiring substrate through vias (hereinafter, signal vias) and arranging other vias (hereinafter, ground vias) having a ground potential around the signal vias.

SUMMARY

One aspect of the present disclosure is an interlayer transmission line including: a plurality of dielectric layers stacked on each other; a signal via that penetrates the plurality of dielectric layers in a stacking direction, and mutually connects signal patterns disposed on two external faces of the plurality of dielectric layers externally exposed; a ground plane that is disposed between the dielectric layers, and covers an area surrounding a circular removal region centered around the signal via; and a plurality of ground vias that penetrate at least one layer of the dielectric layers in the stacking direction of the dielectric layers, are disposed along a plurality of concentric circles centered around the signal via, and are electrically connected with the ground plane.

DETAILED DESCRIPTION OF THE PREFERRED EMBODIMENTS

JP 2015-50680A describes a technique for forming a low-loss transmission line (hereinafter, interlayer transmission line) used for signal transmission in the stacking direction of a substrate by mutually connecting signal line patterns routed on both faces of a multilayer wiring substrate through vias (hereinafter, signal vias) and arranging vias (hereinafter, the ground vias) having a ground potential around the signal vias.

However, as a result of detailed study by the inventor, an issue was found in the related art described in JP 2015-50680A in that transmission of a signal having a high frequency impairs the clearance between patterns including a land pattern of the vias and a pattern of the signal lines, thereby causing manufacturing to be difficult.

That is, a transmission line according to the related art forms a pseudo coaxial line including a signal via as an internal conductor and a ground via as an external conductor. Thus, an increase in frequency requires a smaller distance between the signal via and the ground via. However, the size of the patterns and clearance between the patterns are determined on the basis of the manufacturing technique, and cannot be reduced even when the frequency of the signal is high. Thus, an increase in the frequency causes a decrease in the flexibility of the arrangement of patterns, and causes difficulty in manufacturing of a low-loss interlayer transmission line.

The present disclosure provides a technique for realizing an interlayer transmission line that can be readily manufactured regardless of the frequency of the transmitted signals.

Embodiments of the present disclosure will be described with reference to the accompanying drawings.

1. First Embodiment

[1-1. Configuration]

Figure 1:
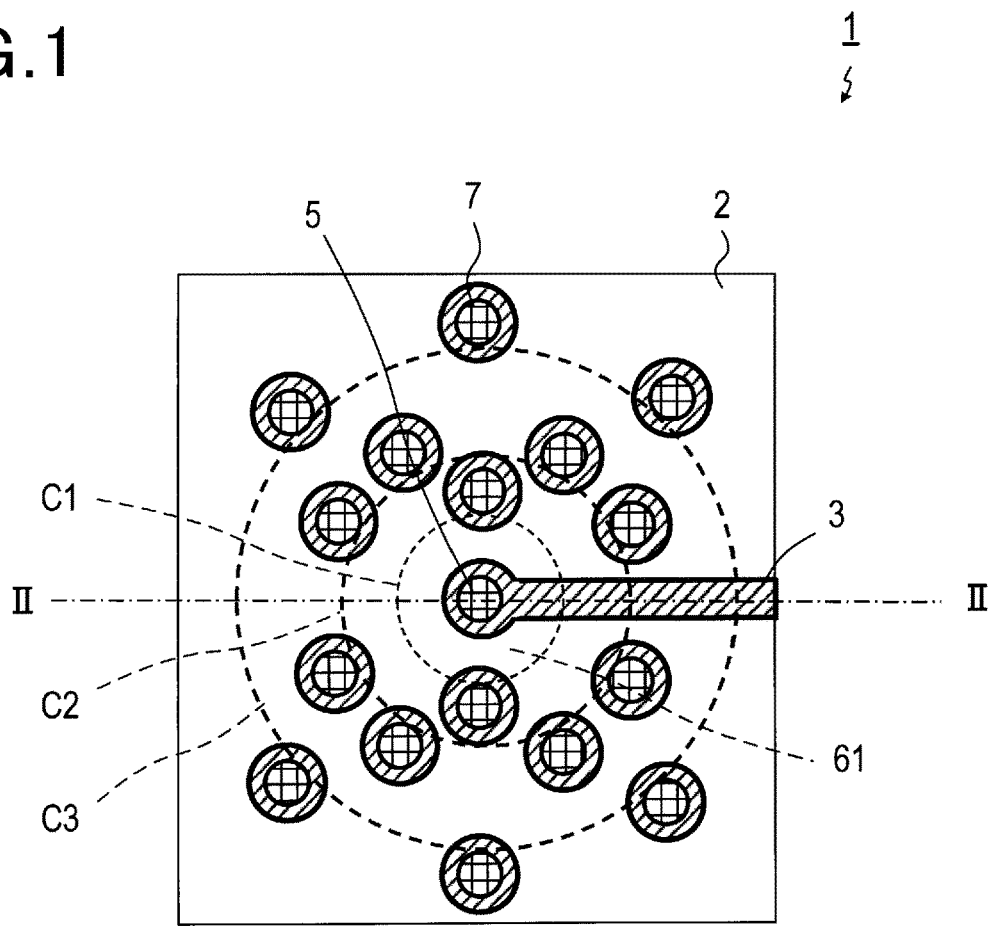
FIG. 1 is a plan view of an interlayer transmission line according to a first embodiment.
Figure 1:
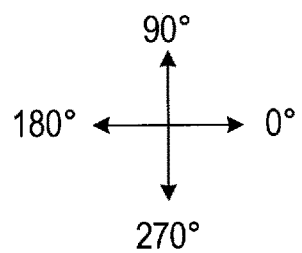
Figure 2:
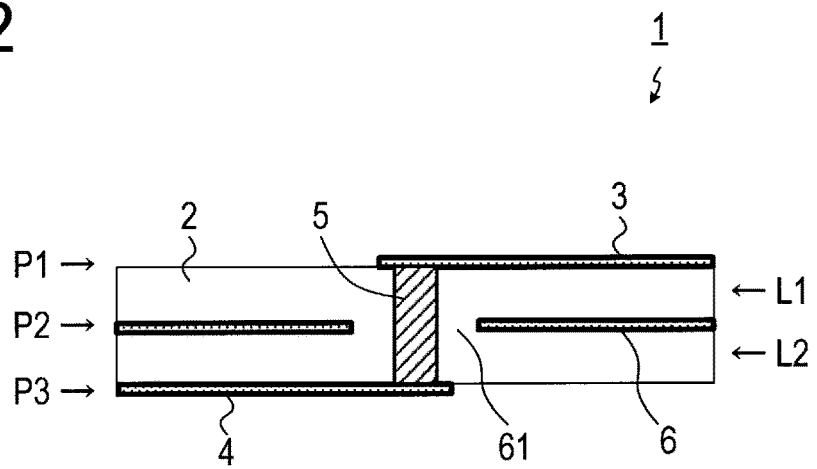
FIG. 2 is a cross-sectional view taken along line II-II in FIG. 1.

An interlayer transmission line 1 illustrated in FIGS. 1 and 2 is formed on a multilayer substrate 2 having three pattern layers P1 to P3 between which two dielectric layers L1 and L2 are disposed. Hereinafter, the two pattern layers P1 and P3, among the pattern layers P1 to P3, disposed most outward and exposed to the outside are referred to as outer layers, and the other pattern layer P2 is referred to as an intermediate layer.

The outer layers P1 and P3 respectively include signal-line patterns 3 and 4 that serve as waveguides for transmitting high-frequency signals. The signal-line patterns 3 and 4 are made of, for example, copper foil deposited by etching, or the like. The tips of both of the signal-line patterns 3 and 4 are disposed facing each other across the two dielectric layers L1 and L2 and mutually connected through a via (hereinafter, signal via) 5 penetrating the multilayer substrate 2.

The intermediate layer P2 has a circular removal region 61 centered around the signal via 5, and a ground plane 6 covering the whole area of the faces of the intermediate layer P2, with which the two dielectric layers L1 and L2 are brought into contact, excepting the removal region 61. In other words, the signal via 5 has a structure that is non-conductive with the ground plane 6. Note that the radius of the removal region 61 is set such that the position of the external conductor of a coaxial line including the signal via 5 as an internal conductor matches the outer circumference of the removal region 61. In specific, the radius is determined in consideration of the frequency of the signal transmitted through the signal via 5, the impedance of the interlayer transmission line 1 including the signal via 5 (for example, 50Ω), the permittivity of the dielectric layers L1 and L2, etc.

A plurality of vias (hereinafter, ground vias) 7 provided around the signal via P penetrate the multilayer substrate 2 in the stacking direction and electrically connect with the ground plane 6.

Each ground via 7 is disposed along one of three concentric circles C1 to C3 centered around the signal via 5, and the through-hole of each ground via 7 is externally tangent to the corresponding concentric circle.

The concentric circle C1 is a circle along the outer circumference of the removal region 61, and, hereinafter, referred to as a first concentric circle.

The concentric circles C2 and C3 are each a circle having a radius that is an integral multiple of $\lambda g/2$, where the in-tube wavelength of the signal propagating through the signal via 5 is $\lambda g$. Here, the circle having a radius of $\lambda g/2$ is referred to as the second concentric circle C2, and the circle having a radius of $\lambda g$ is referred to as the third concentric circle C3.

In the description below, angle is defined on the basis that the routing direction of the signal-line pattern 3 from the signal via 5 is defined as zero degrees, and the counterclockwise direction around the signal via 5 is defined as the positive direction. A total of two ground vias 7 are disposed on the first concentric circle C1 at 90° and 270°. A total of eight ground vias 7 are disposed on the second concentric circle C2 on the two sides of the lines of 45°, 135°, 225° and 315° (for example, within ±10°). A total of six ground vias 7 are disposed on the third concentric circle C3 at 90° and 270°, and at 45°, 135°, 225° and 315°.

That is, the ground vias 7 externally tangent to the third concentric circle C3 are disposed between the ground vias 7 externally tangent to the second concentric circle C2 in view from the center of the concentric circles, and do not overlap with the signal-line patterns 3 and 4. In view from the center of the concentric circles, the ground vias 7 externally tangent to the second concentric circle C2 do not overlap with the ground vias 7 externally tangent to the first concentric circle C1 and the signal-line patterns 3 and 4 in view from the signal via

[1-2. Advantageous Effects]

According to the first embodiment described in detail above, the following advantageous effects are achieved.

(1a) In the interlayer transmission line 1, the ground vias 7 are disposed along the concentric circles C1 to C3 centered around the signal via 5. Thus, in comparison with the case in which the ground vias 7 are disposed at the positions of the outer conductors of a coaxial line including the signal via 5 as a central conductor, sufficient clearance can be maintained between the ground vias 7 and between the ground vias 7 and the signal-line patterns 3 and 4. As a result, the interlayer transmission line 1 can be readily designed and manufactured.

(1b) In the interlayer transmission line 1, the radius of each of the concentric circles C2 and C3 on which the ground vias 7 are disposed is set to an integral multiple of $\lambda g/2$. Thus, high-frequency signals transmitted through the signal via 5 can be efficiently trapped, and low-loss transmission can be achieved.

Figure 3:
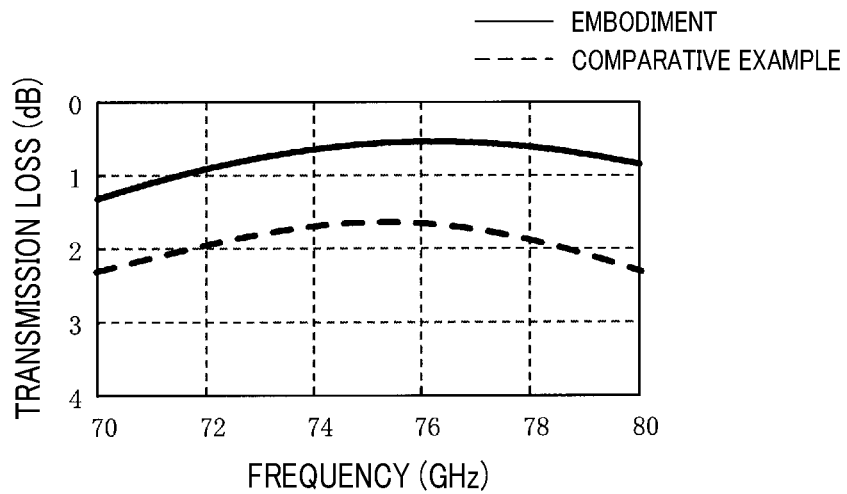
FIG. 3 is a graph illustrating a result of transmission loss determined through simulation.

FIG. 3 is a graph illustrating the result of determining the transmission loss of the interlayer transmission line 1 through a simulation. For comparison, the characteristics of a comparative example are also illustrated, the comparative example including only the ground vias 7 externally tangent to the first concentric circle C1. FIG. 3 indicates that the transmission loss in the interlayer transmission line 1 is improved by approximately 1 dB compared with that of the comparative example.

2. Second Embodiment

[2-1. Difference from First Embodiment]

The basic configuration of the second embodiment is similar to that of the first embodiment. Thus, the second embodiment will be described through the difference from the first embodiment. Note that the reference signs that are the same as those in the first embodiment denote the same configurations. Thus, the foregoing description should be referred to.

The configuration of the multilayer substrate according to the second embodiment further includes additional ground vias in some areas, unlike that according to the first embodiment.

Figure 4:
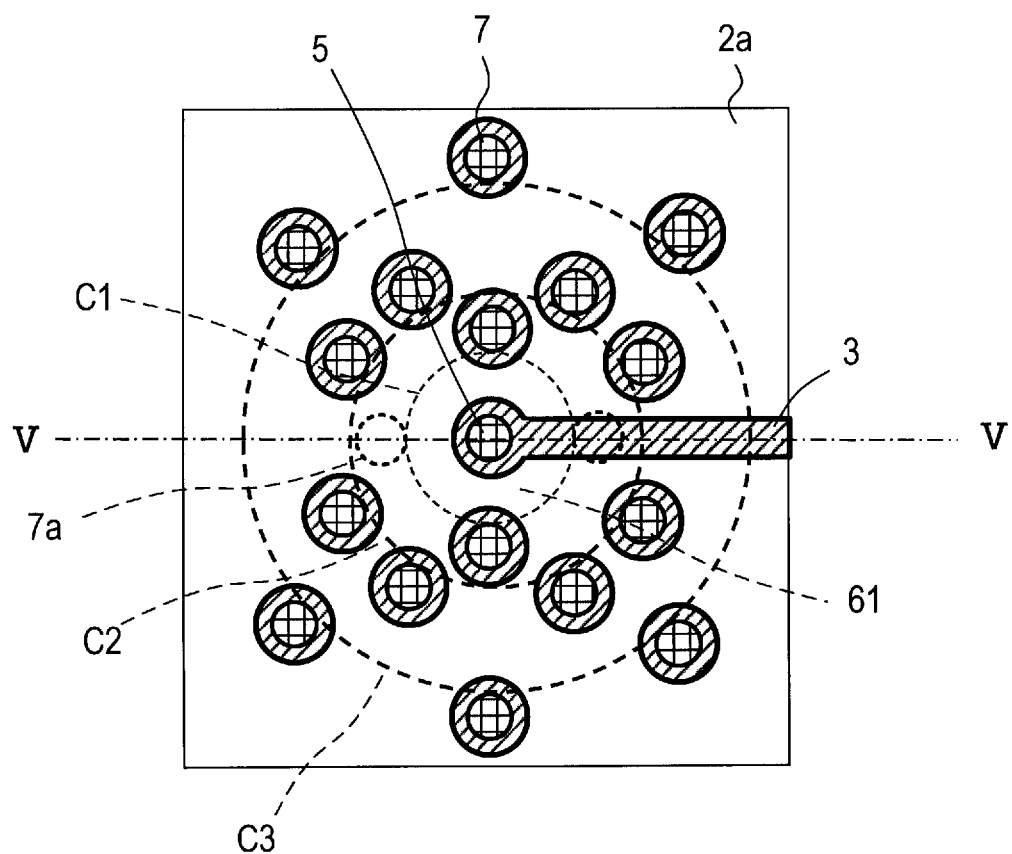
FIG. 4 is a plan view of an interlayer transmission line according to a second embodiment.
Figure 5:
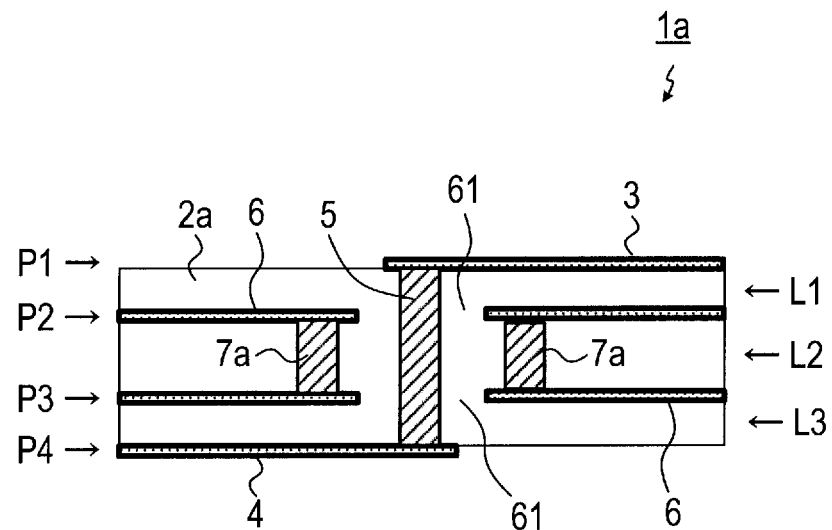
FIG. 5 is a cross-sectional view taken along line V-V in FIG. 4.

An interlayer transmission line 1a illustrated in FIGS. 4 and 5 is formed on a multilayer substrate 2a. The multilayer substrate 2a includes three dielectric layers L1 to L3, and four pattern layers P1 to P4 between which the three dielectric layers L1 to L3 are disposed. Hereinafter, the pattern layers P1 and P4 disposed most outward are referred to as outer layers, and the other pattern layers P2 and P3 are referred to as intermediate layers, among the pattern layers P1 to P4.

The outer layers P1 and P4 respectively include signal-line patterns 3 and 4. The tips of the signal-line patterns 3 and 4 are disposed facing each other across the three dielectric layers L1 to L3 and mutually connected through a via (hereinafter, signal via) 5 penetrating the multilayer substrate 2a.

The intermediate layers P2 and P3 each have a ground plane 6.

The multilayer substrate 2a is provided with a total of 16 ground vias 7 at positions similar to those in the first embodiment, and two more ground vias (hereinafter, interlayer vias) 7a.

The interlayer vias 7a are disposed respectively at 0° and 180° in view from the center of the concentric circles. The interlayer vias 7a penetrate the dielectric layer L2 and electrically connects the two ground planes 6 of the intermediate layer P2 and P3.

[2-2. Advantageous Effects]

According to the second embodiment described in detail above, the following advantageous effect is provided in addition to the advantageous effects (1a) and (1b) of the first embodiment.

(2a) In the interlayer transmission line 1a, the interlayer vias 7a are disposed respectively at the positions of the signal-line patterns 3 and 4, i.e., at 0° and 180°, in view from the center of the concentric circles. Thus, the interlayer transmission line 1a can effectively trap high-frequency signals transmitted through the signal via 5, and thereby increase transmission efficiency.

3. Third Embodiment

[3-1. Difference from Second Embodiment]

The basic configuration of the third embodiment is the same as that of the second embodiment. Thus, the third embodiment will be described through the difference from the second embodiment. Note that the reference signs that are the same as those in the first and second embodiments denote the same configurations. Thus, the foregoing description should be referred to.

In the third embodiment, the structure of the ground vias provided in the second and third concentric circles differs from that according to the second embodiment.

Figure 6:
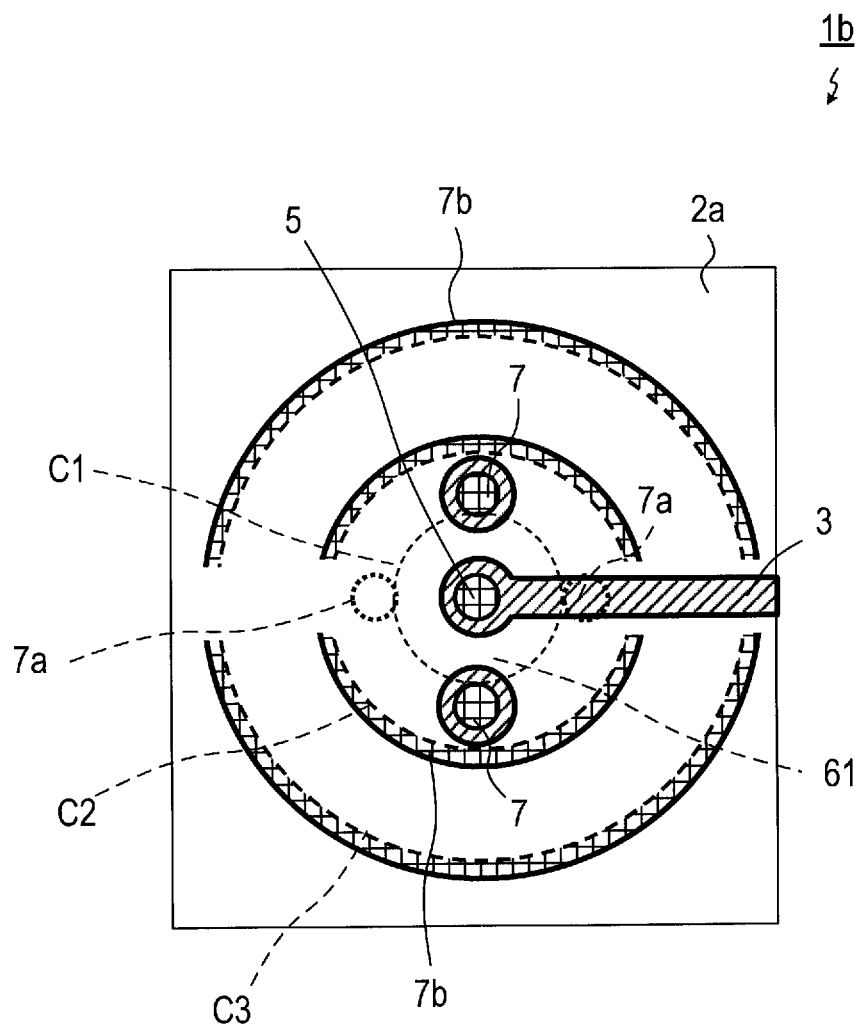
FIG. 6 is a plan view of an interlayer transmission line according to a third embodiment.

An interlayer transmission line 1b illustrated in FIG. 6 includes a multilayer substrate 2a including three dielectric layers L1 to L3 and four pattern layers P1 to P4, like the second embodiment.

The signal-line patterns 3 and 4, the signal via 5, the two ground vias 7 disposed along the first concentric circle C1, and the two interlayer vias 7a are the same as those according to the second embodiment.

On the second and third concentric circles C2 and C3, copper foil walls 7b penetrating the multilayer substrate 2a are disposed along the concentric circles C2 and C3 except for the area in which the signal-line patterns 3 and 4 are routed, in place of the ground vias 7. That is, the copper foil walls 7b form two concentric ground vias having via-diameters that are the same as those of the second and third concentric circles C2 and C3, respectively.

[3-2. Advantageous Effects]

According to the second embodiment described in detail above, the following advantageous effect is achieved in addition to the advantageous effects (1a) and (1b) of the first embodiment.

(3a) The interlayer transmission line 1b can even more effectively trap signals propagating through the signal via 5 by the ground vias 7, the interlayer vias 7a, and the copper foil walls 7b, thereby further improving the transmission efficiency.

4. Other Embodiments

While the embodiments of the disclosure have been described above, the embodiments should not be construed to limit the disclosure, and various modifications can be made to the embodiments.

(4a) In the above-described embodiments, a multilayer substrate including two or three dielectric layers is described. Alternatively, a multilayer substrate that is a laminate of more dielectric layers may be used. In such a case, the configuration is the same as that of the above-described embodiments, except for an increase in the number of intermediate layers including ground planes 6.

(4b) In the above-described embodiments, the ground vias 7, etc., are disposed along the three concentric circles. However, the number of concentric circles is not limited thereto. For example, the number of concentric circles may be two, or four or more.

(4c) In the above-described second and third embodiments, the interlayer vias 7a are disposed only in areas in which the signal-line patterns 3 and 4 are routed. However, the interlayer vias 7a may also be disposed in other areas.

(4d) In the above-described second and third embodiments, the interlayer vias 7a penetrate only the dielectric layer L2 and are entirely buried in the multilayer substrate 2a. However, one end of each of the interlayer vias 7a may be exposed on the outer layer on which the signal-line patterns 3 and 4 are not routed.

(4e) The multiple functions of a single component in the above-described embodiments may alternatively be achieved by multiple components, or a single function of a single component may alternatively be achieved by multiple components. Multiple functions of multiple components may alternatively be achieved by a single component, or a single function achieved by multiple components may alternatively be achieved by a single component. A portion of the configuration of the embodiments described above may be omitted. Alternatively, at least a portion of the configuration of the embodiments described above may be added to or replace configuration according to another embodiment described above. Note that any aspect included in the technical scope identified by the wording of the claims is an embodiment of the present disclosure.

(4f) In addition to the interlayer transmission line described above, the present disclosure can also be realized in various modes such as a system including the interlayer transmission line as a component and a method of interlayer transmission in a multilayer substrate.

An interlayer transmission line according to an aspect of the present disclosure includes a plurality of dielectric layers (L1 to L3), a signal via (5), a ground plane (6), and a plurality of ground vias (7, 7a, 7b).

The dielectric layers are stacked. The signal via penetrates the dielectric layers in the stacking direction, and mutually connects signal patterns (3, 4) disposed on two external faces of the stacked dielectric layers externally exposed. The ground plane is disposed between the dielectric layers, and covers an area surrounding a circular removal region (61) centered around the signal via. The plurality of ground vias penetrate at least one layer of the dielectric layers in the stacking direction, are disposed along a plurality of concentric circles centered around the signal via, and are electrically connected with the ground plane.

According to such a configuration, flexibility of positioning of the ground vias is high, and clearance between the vias can be readily maintained. Thus, an interlayer transmission line can be readily designed and manufactured.

What is claimed is:

1. An interlayer transmission line comprising:
a plurality of dielectric layers stacked on each other in a stacking direction;
a signal via configured to:
penetrate the plurality of dielectric layers in the stacking direction, and
mutually connect signal patterns disposed on two external faces of the plurality of dielectric layers externally exposed;
one or more ground planes disposed between the plurality of dielectric layers and configured to cover an area surrounding a circular removal region centered around the signal via; and
a plurality of ground vias:
configured to penetrate at least one layer of the plurality of dielectric layers in the stacking direction of the plurality of dielectric layers,
disposed along a plurality of concentric circles centered around the signal via, and
electrically connected with at least one of the one or more ground planes,
wherein a first concentric circle of the plurality of concentric circles has a radius equal to an integral multiple of ½ of an in-tube wavelength of a signal propagating through the signal via.

2. The interlayer transmission line according to claim 1, wherein
the plurality of dielectric layers comprise three or more dielectric layers, and
at least one of the plurality of ground vias penetrates an intermediate layer, the intermediate layer being a dielectric layer other than two dielectric layers including signal-line patterns, and are electrically connected with the one or more ground planes in contact with the intermediate layer.

3. The interlayer transmission line according to claim 1, wherein one of the plurality of concentric circles along which the plurality of ground vias are disposed matches an outer circumference of the circular removal region.

4. The interlayer transmission line according to claim 1, wherein a radius of the circular removal region is set to match a radius of an external conductor of a coaxial line including the signal via as an inner conductor.

5. The interlayer transmission line according to claim 1, wherein the plurality of ground vias are each disposed externally tangent to one of the plurality of concentric circles.

6. The interlayer transmission line according to claim 5, wherein the plurality of ground vias externally tangent to an outer concentric circle are disposed between the plurality of ground vias externally tangent to an inner concentric circle in view from a center of the plurality of concentric circles, the outer concentric circle and the inner concentric circle being two adjacent to each other among the plurality of concentric circles.

7. The interlayer transmission line according to claim 1, wherein at least one of the plurality of ground vias has the same radius as a radius of one of the plurality of concentric circles.

8. An interlayer transmission line comprising:
a plurality of dielectric layers stacked on each other in a stacking direction;
a signal via configured to:
penetrate the plurality of dielectric layers in the stacking direction, and
mutually connect signal patterns disposed on two external faces of the plurality of dielectric layers externally exposed;
one or more ground planes disposed between the dielectric layers and configured to cover an area surrounding a circular removal region centered around the signal via; and
a plurality of ground vias:
configured to penetrate at least one layer of the dielectric layers in the stacking direction of the dielectric layers,
disposed along a first concentric circle centered around the signal via having a first radius and a second concentric circle centered around the signal via having a second radius greater than the first radius, the first concentric circle being adjacent to the second concentric circle, and
electrically connected with at least one of the one or more ground planes,
wherein each ground via disposed on the second concentric circle is disposed between and non-overlapping with a pair of ground vias disposed on the first concentric circle with respect to an angle around a center of the signal via.

9. The interlayer transmission line according to claim 8, wherein
the plurality of dielectric layers comprise three or more dielectric layers, and
at least one of the plurality of ground vias penetrates an intermediate layer, the intermediate layer being a dielectric layer other than two dielectric layers including the signal-line patterns, and are electrically connected with the one or more ground planes in contact with the intermediate layer.

10. The interlayer transmission line according to claim 8, wherein one of the plurality of concentric circles along which the plurality of ground vias are disposed matches an outer circumference of the circular removal region.

11. The interlayer transmission line according to claim 8, wherein a radius of the circular removal region is set to match a radius of an external conductor of a coaxial line including the signal via as an inner conductor.

12. An interlayer transmission line comprising:
a plurality of dielectric layers stacked on each other in a stacking direction;
a signal via configured to:
penetrate the plurality of dielectric layers in the stacking direction, and
mutually connect signal patterns disposed on two external faces of the plurality of dielectric layers externally exposed;
one or more ground planes disposed between the dielectric layers and configured to cover an area surrounding a circular removal region centered around the signal via; and
a plurality of ground vias:
configured to penetrate at least one layer of the dielectric layers in the stacking direction of the dielectric layers,
disposed along a plurality of concentric circles centered around the signal via, and
electrically connected with at least one of the one or more ground planes,
wherein at least one of the plurality of ground vias has a same radius as one of the plurality of concentric circles.

13. The interlayer transmission line according to claim 12, wherein
the plurality of dielectric layers comprise three or more dielectric layers, and
at least one of the plurality of ground vias penetrates an intermediate layer, the intermediate layer being a dielectric layer other than two dielectric layers including the signal-line patterns, and are electrically connected with the one or more ground planes in contact with the intermediate layer.

14. The interlayer transmission line according to claim 12, wherein one of the plurality of concentric circles along which the plurality of ground vias are disposed matches an outer circumference of the circular removal region.

15. The interlayer transmission line according to claim 12, wherein a radius of the circular removal region is set to match a radius of an external conductor of a coaxial line including the signal via as an inner conductor.

* * * * *